United States Patent [19]

Tsuta

[11] Patent Number: 5,488,292
[45] Date of Patent: Jan. 30, 1996

[54] WAFER INSPECTING SYSTEM

[75] Inventor: Kiyoaki Tsuta, Mitaka, Japan

[73] Assignee: Tokyo Seimitsu Co., Ltd., Tokyo, Japan

[21] Appl. No.: 130,831

[22] Filed: Oct. 4, 1993

[51] Int. Cl.$^6$ .................................................. G01R 31/02
[52] U.S. Cl. ...................................... 324/158.1; 324/754
[58] Field of Search .......................... 324/158 F, 158 R, 324/73.1, 158.1, 754

[56] References Cited

U.S. PATENT DOCUMENTS

| | | | |
|---|---|---|---|
| 3,665,504 | 5/1972 | Silverman | 324/404 |
| 3,758,857 | 9/1973 | Simpson et al. | 324/158 MG |
| 4,429,275 | 1/1984 | Cedrone | 324/158 F |
| 4,868,493 | 9/1989 | Becker | 324/158 F |
| 4,900,939 | 2/1990 | Aoyama | 250/548 |
| 5,256,204 | 10/1993 | Wu | 118/719 |

FOREIGN PATENT DOCUMENTS 62-86835  4/1987  Japan .

*Primary Examiner*—Ernest F. Karlsen
*Attorney, Agent, or Firm*—Oliff & Berridge

[57] ABSTRACT

A wafer inspecting system is provided, in which the inspecting time for one cassette stocking plurality of wafers are shortened. The wafer, which is stored in the cassette among four cassettes stocked in the cassette stocking part, is taken out from the cassette by the automated truck of the wafer conveying system one by one, and then, conveyed to the respective wafer probers by the automated truck. And, the wafer that has been inspected by the respective wafer probers is conveyed to the former cassette and stored by the automated trucks, and further, another wafer to be inspected is taken out from the cassette 36A and conveyed to one of the wafer probers. And, when all wafers stored in the cassette have been inspected, the cassette is taken out from the cassette stocking part and the following steps are performed. As a result, the inspecting time for one cassette can be shortened substantially.

12 Claims, 2 Drawing Sheets

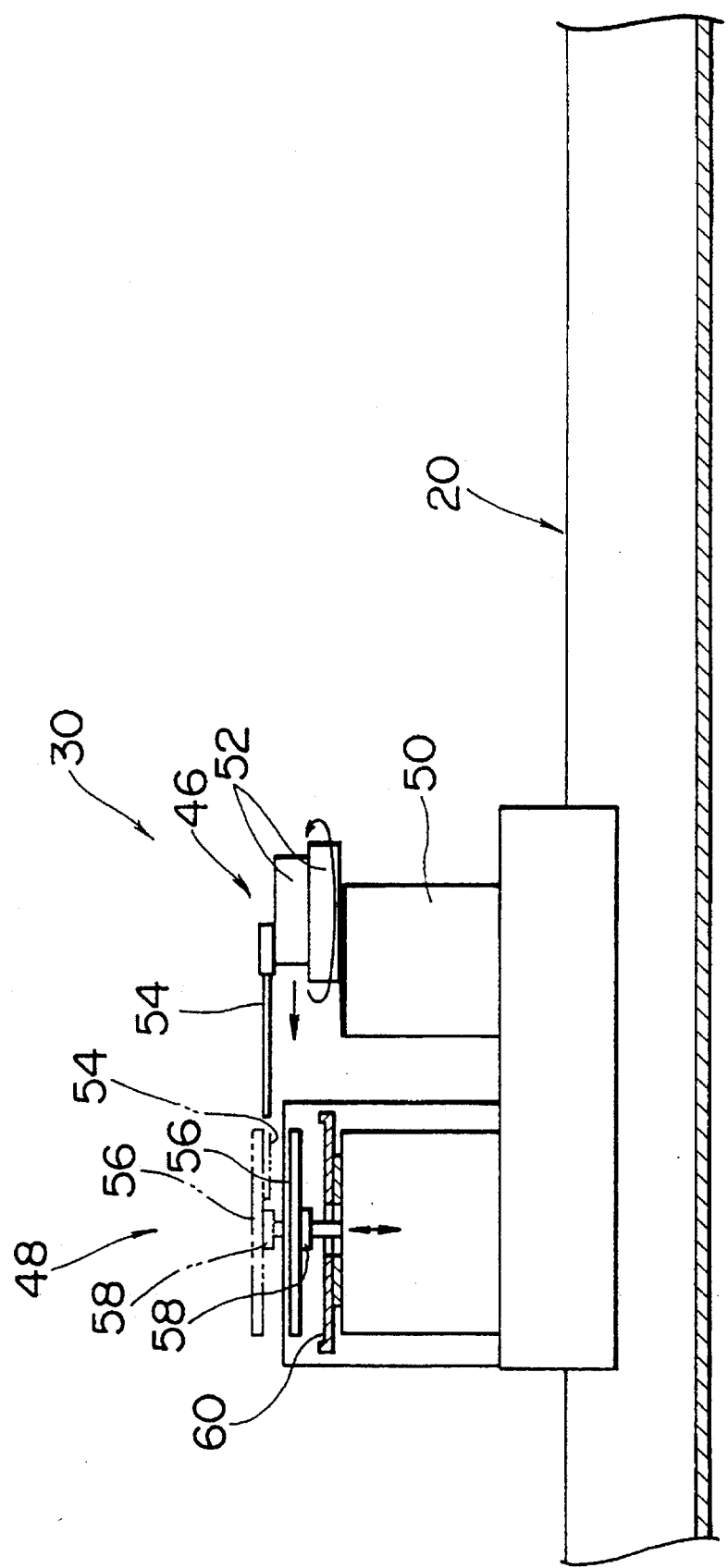

WAFER INSPECTING SYSTEM

BACKGROUND OF THE INVENTION
1. Field of the Invention

This invention relates to a wafer inspecting system, more particularly it relates to a wafer inspecting system for inspecting electric characteristics of circuit patterns formed on a semiconductor wafer.

2. Description of the Related Art

As for a semiconductor wafer, a multiplicity of same circuit patterns are formed on the surface thereof. Each circuit pattern is judged whether it is good or bad for inspecting the electric characteristics of each circuit pattern before the wafer is separated into individual dies.

Said wafer inspecting system is composed of a cassette stocking part, a wafer conveying part, a wafer table, a control part and the like. A cassette storing a multiplicity of wafers to be inspected is attached to the cassette stocking part 4, and the wafers are taken out from the cassette one by one so as to be conveyed to the wafer table by the wafer conveying part. The wafer table holds the wafer, and moves horizontally in the direction of X-Y and vertically in the direction of Z according to the element array during the element inspection.

The control part consists of a probe stage, a tester and the like. A probe card adapting to the wafer to be inspected is mounted to the probe stage and each electrode pad of the circuit is touched to a probe needle provided in the probe card whereby the electric characteristics of each circuit pattern is inspected with the tester one after another.

Further, the wafer that has been inspected is conveyed from the wafer table to the cassette by the wafer conveying part and is stored in the former shelf of the cassette.

However, the conventional wafer inspecting system has a disadvantage in that the inspecting time for one cassette becomes longer because a multiplicity of wafers stored in a cassette are processed with only one wafer prober.

Moreover, as shown in Japan Patent Application Laid-Open No. 62-86835, there is another wafer inspecting system provided with two wafer probing stages and a conveying device for wafer cassettes, wherein a wafer is taken out from the wafer cassette conveyed by the conveying device and then is inspected at the probing stage. This wafer inspecting system can shorten to ½ of the inspecting time for one cassette, however, has the disadvantage in that when there is something wrong with the conveying device, so that the wafer is stopped being conveyed to the probing stage, therefore, the inspection is not performed efficiently and the inspecting time for one cassette becomes longer.

SUMMARY OF THE INVENTION

This invention has been developed to eliminate the above-described disadvantage and aims to provide a wafer inspecting system wherein the inspecting time for one cassette can be saved.

To achieve the above-described aim, according to the present invention, a wafer inspecting system comprising: a plurality of wafer probers, which are arranged at predetermined intervals; a cassette stocking part capable of stocking a multiplicity of cassettes each housing therein a multiplicity of wafers to be inspected; and a wafer conveying means for taking out the wafers housed in a predetermined cassette in the cassette stocking part from the cassette one after another and conveying the wafers to said plurality of wafer inspecting parts, and conveying the wafers which have undergone the inspection to the initial cassette and housing.

According to this invention, first, the wafer stored in the first cassette among plural cassettes stocked in the cassette stocking part is taken out from the cassette one after another and then is conveyed to the respective plural wafer probers. Next, the wafer which has been inspected by the prober is conveyed to the former cassette and stored one after another, and further another wafer to be inspected is taken out from the cassette and conveyed to the wafer prober which is waiting for the inspection.

As a result, the inspecting time for one cassette can be saved according to the number of the wafer probers. For instance, when eight wafer probers are set up, the inspecting time can be shortened to ⅛ of the time compared with the conventional wafer inspecting system which inspects and processes one cassette with one wafer prober.

Further, all wafers stored in the first cassette have been inspected, and then, the inspection of the wafers stored in the second cassette stock begins. And, the first cassette is taken out from the cassette stock and then is changed for a new one in which wafers to be inspected are stored. The cassette in which the wafers have been inspected is exchanged to a new one, and then the next process is performed one by one like this.

BRIEF DESCRIPTION OF THE DRAWINGS

The exact nature of the invention, as well as other objects and advantages thereof, will be readily apparent from consideration of the following specifications relating to the accompanying drawings, in which like reference characters designate the same or similar parts throughout the figures thereof and wherein:

FIG. 2 is a side view showing the wafer conveying truck applied to the wafer inspecting system according to this invention.

DESCRIPTION OF THE PREFERRED EMBODIMENT

Figure 1:
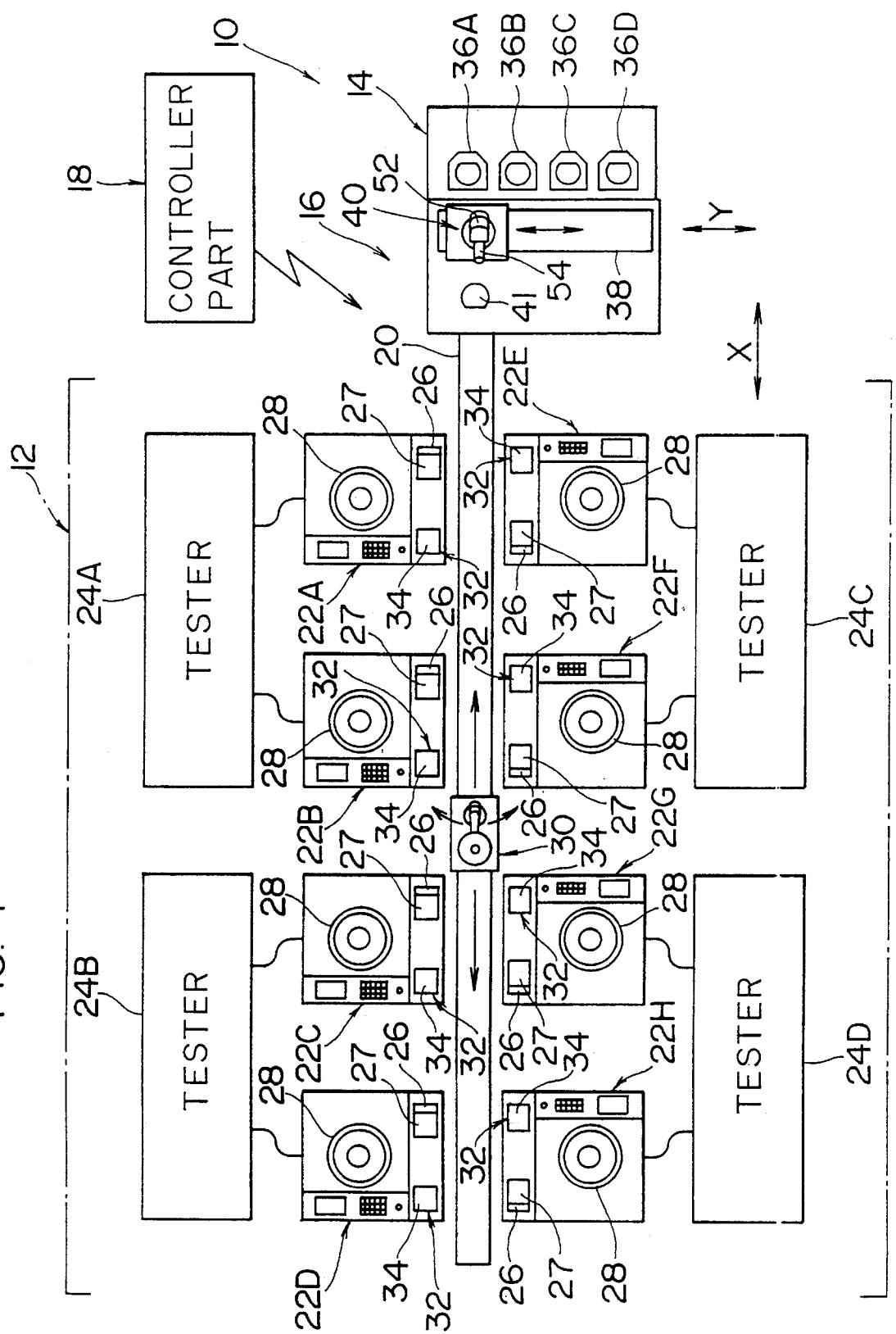
FIG. 1 is a plane view showing an embodiment of the wafer inspecting system according to this invention.

Detail description will hereunder be given of the preferred embodiment of a wafer inspecting system according to the present invention with reference to the accompanying drawings.

FIG. 1, is a plane view showing an embodiment of a wafer inspecting system 10 according to this invention. The wafer inspecting system 10 consists of a wafer inspecting part 12, a cassette stocking part 14, a wafer conveying device 16 and a controller part 18.

In the wafer inspecting part 12, four wafer probers 22A, 22B, 22C and 22D are placed in one side (upper side in FIG. 1) of a conveying rail 20 of the wafer conveying device 16 and other four wafer probers 22E, 22F, 22G and 22H are arranged on the other side (lower side in FIG. 1) at a predetermined intervals and facing each other. Moreover, four testers 24A, 24B, 24C and 24D are connected to two wafer probers each.

The wafer prober 22A is provided with the first wafer conveying part 26, a wafer supply part 27, a probe stage 28 and tile like. In the wafer conveying part 26, the wafer, which is conveyed by an automated truck 30 (treated later) of the wafer conveying device 16, is received at the wafer supply part 27, and then conveyed to a table (not shown)

placed under the probe stage 28. The table holds the wafer, and can move horizontally in the direction of X-Y and vertically in the direction of Z according to the element array during the element inspection.

A probe card (not shown) adapting to the wafer to be inspected is attached to the probe stage 28 and each electrode pad of the circuit is touched with a probe needle provided in the probe card whereby the electric characteristic of each circuit pattern is inspected with the tester 24A one after another. The wafer which has been inspected is conveyed to the supply part 27 by the wafer conveying part 26. When the wafer is conveyed to the supply part 27, signals, which indicate the conveying end, are output to the controller part 18.

The wafer prober 22A is provided with a cassette stocking part 32. A cassette 34 is attached to the cassette stocking part 32. When there are a multiplicity of wafers which have been inspected and are waiting for conveying thereby a waiting time occurs, the cassette 34 is used as a buffer, so that the disadvantage is avoided in that the user waits for the conveying part to become vacant with mounting the wafer on the wafer table.

Further, the structure of the other wafer probers 22B–22H is the same as that of the wafer prober 22A, therefore, the explanation is omitted.

In the cassette stocking part 14, four cassettes 36A, 36B, 36C and 36D housing a multiplicity of wafers to be inspected are arranged at a predetermined intervals. The cassettes 36A–36D can be moved up and down by a raising and lowering device (not shown) located in the cassette stocking part 14.

Incidentally, the raising and lowering device is driven under control by the controller part 18.

The wafer conveying device 16 has a conveying rail 20 located in the direction of X in FIG. 1 and a conveying rail 38 located in the direction of Y perpendicular to the conveying rail 20, and further, the conveying rail 20 is provided with an automated truck 30 and the conveying rail 38 is provided with an automated truck 40 movably. Moreover, a chuck 41 for the wafer relay is located near the automated truck 40.

As shown in FIG. 2, the automated truck 30 is attached to the conveying rail 20 so as to be movable and can move along the conveying rail 20 by rotating wheels connected with a drive motor (not shown) which can rotate positively and reversely in the automated truck 30.

On the other hand, the automated truck 30 is provided with a chucking robbot 46 and a holding part 48. The chucking robbot 46 has a drive motor 50 which is connected with a transportation jig 52. The transportation jig 52 can rotate by 180° while moving in the direction of the arrow in FIG. 2 by driving the drive motor 52. Moreover, a chucking arm 54 is fixed to the transportation jig 52. The chucking arm 54 can hold a wafer 56 and be mounted on a delivery chuck 58 in the holding part 48. As soon as the wafer 56 is mounted on the delivery chuck 58, it is held to the delivery chuck 58 so as to descend, whereby held stably by a plate 60.

Further, as for the structure of the automated truck 40, it has the same chucking robbot 46 as that of the automated truck 30, therefore, the explanation is omitted.

Moreover, the traveling directions and the traveling distances of the automated trucks 30 and 40, the drive motor 50 and the raising and lowering of the delivery chuck 58 are controlled by the controller part 18.

Next, the explanation is given of the control method with the controller part 18 in the wafer inspecting system 10 constructed like the above-mentioned.

First, the automated truck 40 is moved to the position shown in FIG. 1. Next, the automated truck 40, the chucking robbot 46 and the raising and lowering device for the first cassette 36A are controlled, and then the wafer 56 stored in the cassette 36A is taken out from the cassette 36A with the wafer chucking arm 54 one by one and is mounted on the relay chuck 41 by rotating the transportation jig 52 by 180°.

Next, the automated truck 30 is moved to the right side in FIG. 1. And, the chucking robbot 46 and the holding part 48 of the automated truck 80 are controlled, the wafer 56 mounted on the relay chuck 41 is held by the wafer chucking arm 54 of the automated truck 30, and the transportation jig 52 is rotated by 180° to be mounted on the delivery chuck 58 and held by the delivery chuck 58, and then, the delivery chuck 58 is lowered so as to be held on a plate 60.

Then, the automated truck 30 is traveled in the left direction of FIG. 1 and stopped at the position of wafer conveying part 26 of the wafer prober 22A. And, the delivery chuck 58 is raised to separate the wafer 56 from the plate 60 and the wafer 56 is held by the chucking arm 54. Afterwards, the transportation jig device 52 is rotated clockwise by 90° and mounted on the supply part 27 in the wafer conveying part 26. The wafer 56 mounted on the supply part 27 is conveyed to the wafer table by the wafer conveying part 26 and then inspected.

Thus, as for other wafer probers 22B–22H, the other wafers 56, 56 . . . in the cassette 36A are conveyed individually and then inspected by the respective wafer probers 22B–22H.

Next, the wafer 56, which has been inspected, in any wafer prober 22A–22H is conveyed to the supply part 27 thereof, and then, is conveyed to the cassette 36A and stored by the wafer conveying device 16 one after another. The wafer stocking method with the wafer conveying device 16 is the reverse-process of the wafer providing method, therefore, the explanation is omitted.

And, when all wafers 56, 56 . . . in the first cassette 36A have been inspected by repeating the providing and the stocking of the wafer 56, the cassette 36A is taken out from the cassette stocking part 14 and the following steps are performed. Then, the inspection of the wafer 56 stored in the second cassette 36B is begun and a new cassette storing wafers to be inspected is placed in the position of the cassette stocking part 14 in which the cassette 36A is taken out. Then, all wafers 56 in the second cassette 36B have been inspected, the cassette 36B is taken out from the cassette stocking part 14 and the following steps are performed.

The cassette in which the wafers have been inspected is changed for a new cassette like this, and then the following steps are performed one by one.

As a result, the inspecting time for one cassette can be saved according to the number of the wafer inspecting part in this embodiment. For instance, when eight wafer probers 22A–22H are set up like this embodiment, the inspecting time can be shortened to ⅛ of the time compared with the conventional wafer inspecting system which inspects and processes one cassette with one wafer prober at a time. The description has been given of the inspecting processes for one kind wafer 56 in this embodiment, however, this invention will not be limited, when respective kinds of wafers are stored in the cassettes 36A–36D, the automated trucks 30 and 40 may be controlled so as to inspect the wafers stored in the cassette 36A by the wafer probers 22A and 22B, the wafers stored in the cassette 36B by the wafer probers 22C and 22D, the wafers stored in the cassette 36C by the wafer probers 22E and 22F and the wafers stored in the cassette 36D by the wafer probers 22G and 22H. As a result, the inspecting time can be shortened to ½ of the time compared with the conventional wafer inspecting system which inspects and processes one cassette with one wafer prober at a time.

Moreover, when the wafer conveying device 16 is used for conveying the wafer 56 to another wafer prober after inspecting the wafer 56, the wafer may be taken out from the cassette 34 and then inspected. As a result, the inspection of the wafer can be performed efficiently.

And, when there is something wrong with the conveying part, as a result, the whole processes are stopped, wafers may be taken out from the cassette 34 mounted on the probers 22A–22H and then processed.

Further, chucking arms are provided in the respective wafer probers 22A–22H, whereby the wafer 56 held with the delivery chuck 58 by this chucking arm may be conveyed to the wafer prober among 22A–22H.

As has been described hereinbefore, in the wafer inspecting system according to this invention, wafers to be inspected in a predetermined cassette among plural cassettes stocked in a cassette stocking part are taken out from the cassette one by one and conveyed to plural wafer inspecting parts, and then, the wafers which have been inspected by the plural wafer inspecting parts are conveyed to the respective former cassettes and stored one after another. As a result, the inspecting time for one cassette can be saved substantially compared with the conventional wafer inspecting system which inspects and processes one cassette with one wafer inspecting part.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer inspecting system, comprising:
   a cassette storage device capable of storing a plurality of cassettes each cassette containing a plurality of wafers to be inspected;
   a plurality of wafer probing devices arranged at predetermined intervals;
   wafer conveying means for sequentially removing at least one of the plurality of wafers from one of the plurality of cassettes, moving each removed wafer to at least one of said plurality of wafer probing devices and returning each removed wafer which has been inspected by the at least one wafer probing device to the one of the plurality of cassettes from which the wafer was taken; and
   control means for controlling the wafer conveying means.

2. The wafer inspecting system as set forth in claim 1, wherein one type of wafer is stored in each of said plurality of cassettes and said wafer conveying means is controlled by said control means such that removed wafers stored in a current cassette are inspected before the wafers stored in a next cassette are inspected.

3. The wafer inspecting system as set forth in claim 1, wherein each cassette stores one type of wafer and said wafer conveying means is controlled by said control means such that the removed wafers of each cassette are moved to at least one of the plurality of probing devices adapted to the type of wafer stored in each cassette.

4. The wafer inspecting system as set forth in claim 1, wherein said wafer conveying means includes a rail provided along a direction from said cassette storage device to the plurality of wafer probing devices and an automated truck provided movably on said rail, for moving the wafers.

5. The wafer inspecting system as set forth in claim 4, wherein said plurality of wafer probing devices are placed on both sides of said rail at the predetermined intervals.

6. The wafer inspecting system as set forth in claim 4, wherein said automated truck includes a wafer chucking arm for removing, supplying and carrying one of the plurality of wafers, the wafer chucking arm capable of swinging; and
   a tray for carrying the wafer chucked by the wafer chucking arm.

7. A wafer inspecting system, comprising:
   a cassette storage device capable of storing a plurality of cassettes, each cassette containing a plurality of wafers to be inspected;
   a plurality of wafer probing devices arranged at predetermined intervals;
   a first rail provided near said cassette storage device along a plurality of cassettes stored in the cassette storage device;
   a second rail provided near and along said plurality of wafer probing devices;
   a wafer relaying device located between said first rail and said second rail;
   a first automated truck moving along said first rail, the first automatic truck removing wafers stored in said plurality of cassettes, supplying the removed wafers to said wafer relaying device and replacing wafers from said wafer relaying device to the one of said plurality of cassettes from which each wafer was removed;
   a second automated truck moving along said second rail the second automated truck removing wafers from the wafer relaying device to move the removed wafers to at least one of said plurality of wafer probers for inspection and returning inspected wafers to said wafer relaying device;
   control means for controlling said first automated truck and said second automated truck.

8. The wafer inspecting system as set forth in claim 7, wherein one type of wafer is stored in each cassette, and said first and second automated trucks are controlled by said control means such that the plurality of wafers stored in a current cassette are inspected before the plurality of wafers stored in a next cassette are inspected.

9. The wafer inspecting system as set forth in claim 7, wherein one type of wafer is stored in each cassette, and said first and second automated trucks are controlled by said control means such that the plurality of wafers of the cassette are inspected by at least one of the plurality of probing devices which are adapted to the type of wafer stored in the cassette.

10. The wafer inspecting system as set forth in claim 7, wherein
    said first automated truck includes a wafer chucking arm for removing and supplying the wafers;
    said second automated truck includes a wafer chucking arm for removing and supplying the wafers and a tray for carrying the wafer chucked by the wafer chucking arm; and
    the wafer chucking arms of the first and second automated trucks are capable of swinging.

11. The wafer inspecting system as set forth in claim 7, wherein each of the plurality of wafer probing devices has a wafer chucking arm for moving wafers supplied by said second automated truck to a position for wafer inspection by the wafer probing device.

12. The wafer inspecting system as set forth in claim 7, wherein each of the plurality of wafer probing devices has a local cassette storage device for storing at least one local cassette, wherein a wafer stored in the a local cassette is removed from the local cassette, is inspected by a current probing device and is moved by said first and second automated trucks to one of a next probing device and the cassette from which the wafer was originally removed.

* * * * *